United States Patent
Hook et al.

(10) Patent No.: US 8,564,074 B2
(45) Date of Patent: Oct. 22, 2013

(54) SELF-LIMITING OXYGEN SEAL FOR HIGH-K DIELECTRIC AND DESIGN STRUCTURE

(75) Inventors: Terence B. Hook, Jericho, VT (US); Vijay Narayanan, New York, NY (US); Jay M. Shah, Poughkeepsie, NY (US); Melanie J. Sherony, Fishkill, NY (US); Kenneth J. Stein, Sandy Hook, CT (US); Helen H. Wang, LaGrangeville, NY (US); Chendong Zhu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/306,621

(22) Filed: Nov. 29, 2011

(65) Prior Publication Data

US 2013/0134545 A1 May 30, 2013

(51) Int. Cl.
*H01L 31/119* (2006.01)

(52) U.S. Cl.
USPC ............ 257/411; 257/412; 257/288; 257/296

(58) Field of Classification Search
USPC .......... 257/410–412, 288, 296, 635; 438/216, 438/255
See application file for complete search history.

(56) References Cited

U.S. PATENT DOCUMENTS

| | | | |
|---|---|---|---|
| 5,178,911 A | 1/1993 | Gordon et al. | |
| 6,891,231 B2 | 5/2005 | Bojarczuk, Jr. et al. | |
| 7,226,831 B1 | 6/2007 | Metz et al. | |
| 7,387,927 B2 | 6/2008 | Turkot, Jr. et al. | |
| 7,423,326 B2* | 9/2008 | Rotondaro et al. | 257/406 |
| 7,479,683 B2 | 1/2009 | Bojarczuk, Jr. et al. | |
| 7,768,079 B2 | 8/2010 | Sandford et al. | |
| 8,030,173 B2* | 10/2011 | Turner et al. | 438/435 |
| 2009/0179282 A1 | 7/2009 | Doyle et al. | |
| 2009/0243031 A1* | 10/2009 | Natzle et al. | 257/508 |
| 2010/0237442 A1* | 9/2010 | Li et al. | 257/411 |
| 2010/0244206 A1 | 9/2010 | Bu et al. | |
| 2011/0175147 A1 | 7/2011 | Adusumilli et al. | |
| 2011/0198696 A1* | 8/2011 | Choi et al. | 257/347 |
| 2012/0223399 A1* | 9/2012 | Carter et al. | 257/412 |

OTHER PUBLICATIONS

Hajas, et al. "Sputtered aluminum-nitride for integration in IC processes," Proc. SAFE/STW, 2004, pp. 643-646.
Klingbeil et al. "Reactively sputtered aluminum nitride in GaAs processing," Solid-State Electronics, vol. 41, Issue 3, Mar. 1997, pp. 429-433.
Gordon, R.G., "New Liquid Precursors for CVD of Metal-Containing Materials" in CVD XV: proceedings of the Fifteenth International Symposium on Chemical Vapor Deposition, ed. Mark Donald Allendorf, Michael L. Hitchman, Electrochemical Society Proceedings, vol. 2000-13, 2000, pp. 248-259, Group 13: Aluminum and Gallium, p. 256.

* cited by examiner

*Primary Examiner* — Dung A. Le
(74) *Attorney, Agent, or Firm* — Michael J. LeStrange; Hoffman Warnick LLC (57) ABSTRACT

A semiconductor device is disclosed. The semiconductor device includes a semiconductor substrate including: a high-K dielectric region; a blocking region disposed against at least one surface of the high-K dielectric region and adapted to form an oxidized layer in response to exposure to oxygen; and an oxygen rich region disposed against the blocking region such that the blocking region is interposed between the oxygen rich region and the high-K dielectric region.

15 Claims, 12 Drawing Sheets

SELF-LIMITING OXYGEN SEAL FOR HIGH-K DIELECTRIC AND DESIGN STRUCTURE

TECHNICAL FIELD

Embodiments of this disclosure relate generally to semiconductor devices and, more particularly, to a semiconductor device including a self-limiting oxygen seal for a high-K dielectric, a related method and design structure.

BACKGROUND

In semiconductor devices, high-K dielectrics are frequently included as a part of or underneath gate elements to decrease device size and increase device performance. The use and effectiveness of high-K dielectrics in devices such as transistors, gates, etc. may be impacted by exposing these dielectrics to oxygen. In these cases, oxygen may diffuse into these high-K dielectrics, causing the threshold voltage and the effective work function of the system to deviate from the desired design values. Some semiconductor devices limit the diffusion of oxygen into high-K dielectrics by placing a blocking layer of excess high-K material or silicon nitride on the sides of the gate to act as a shield. However, in these methods, oxygen may still diffuse into the high-K dielectrics by saturating the blocking layer, diffusing through the blocking layer or diffusing into the gate from below (e.g., through the substrate or other lower layer(s)).

BRIEF SUMMARY

A first aspect of the disclosure provides a semiconductor substrate including: a high-K dielectric region; a blocking region disposed against at least one surface of the high-K dielectric region and adapted to form an oxidized layer in response to exposure to oxygen; and an oxygen rich region disposed against the blocking region such that the blocking region is interposed between the oxygen rich region and the high-K dielectric region.

A second aspect of the disclosure provides a method of forming a semiconductor device, the method including: forming an oxygen rich region in a substrate; forming a gate including a high-K dielectric on the substrate; and depositing a blocking material upon portions of the substrate to form a blocking region interposed between the high-K dielectric and the oxygen rich region, the blocking material adapted to form an oxidized layer in response to exposure to oxygen.

A third aspect of the disclosure provides a design structure tangibly embodied in a machine readable medium for design, manufacturing, or testing a semiconductor device, the design structure including: a substrate including: a high-K dielectric region; a blocking region disposed against at least one surface of the high-K dielectric region and adapted to form an oxidized layer in response to exposure to oxygen; and an oxygen rich region disposed against the blocking region such that the blocking region is interposed between the oxygen rich region and the high-K dielectric region.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the drawings of the disclosure are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 1:
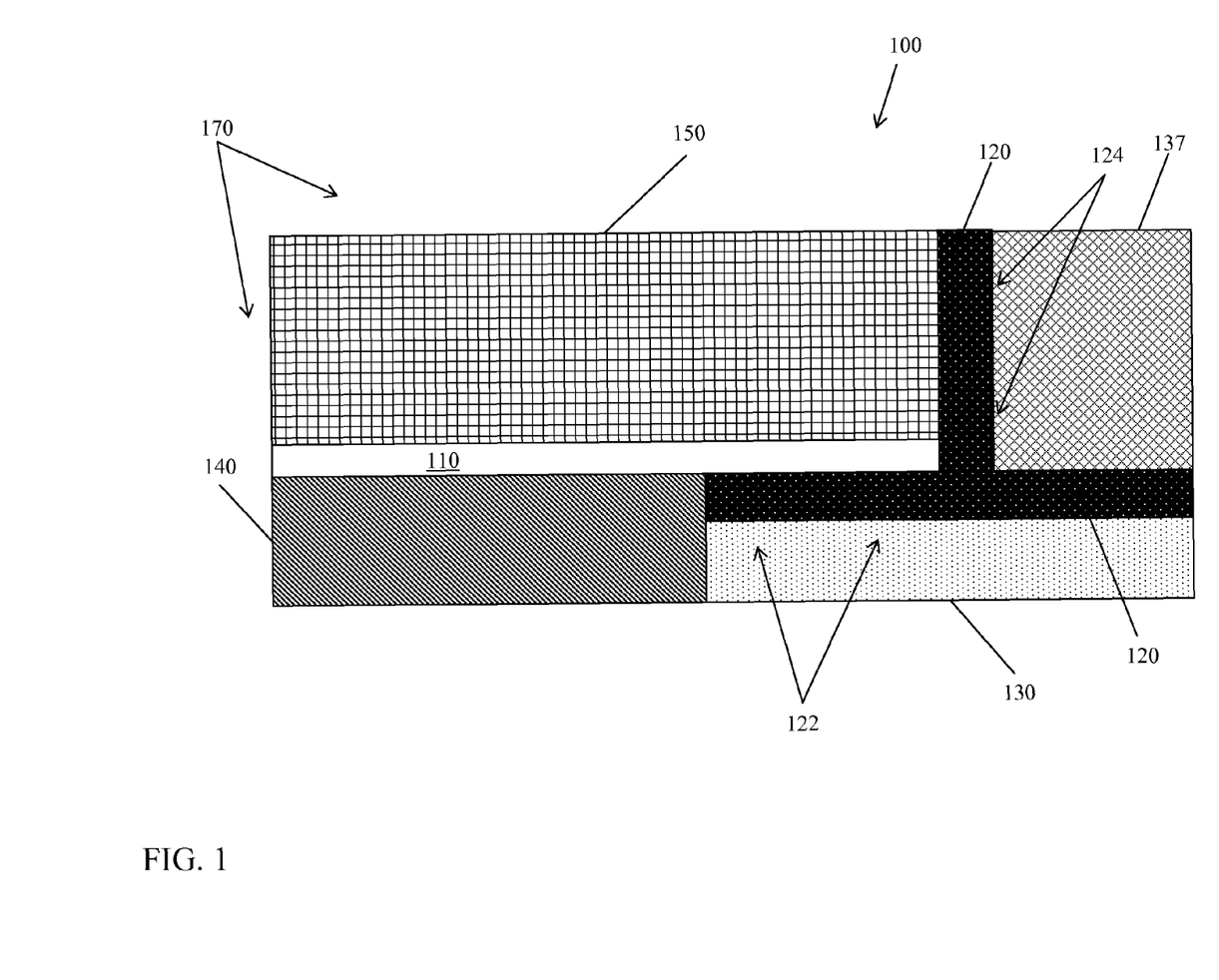
FIG. 1 shows portions of a semiconductor device according to an embodiment of the invention.

FIG. 1 shows a cross sectional view of portions of a semiconductor device 100 according to embodiments of the invention. Semiconductor device 100 may include a substrate 140, with an oxygen rich region 130 (e.g., a shallow trench isolation (STI) region 130) defined and/or formed therein. It is understood that the use of STI region 130 in this embodiment is merely an example, and that any form of region and/or material (e.g., substrate, isolation region, oxygen, etc.) may form or comprise oxygen rich region 130 including materials and/or regions through which oxygen may diffuse.

In any event, semiconductor device 100 may also include a dielectric region 110 disposed between portions of substrate 140, STI region 130 and an electrode region 150, thereby forming a gate 170. In one embodiment, dielectric region 110 may be a high-K dielectric region 110. In one embodiment, semiconductor device 100 may further include a blocking region 120 which may be disposed at least partially about high-K dielectric region 110. Blocking region 120 is adapted to shield oxygen from diffusing into high-K dielectric region 110. In one embodiment, a capping portion 122 of blocking region 120 may be interposed between high-K dielectric region 110 and STI region 130. In another embodiment, a spacing portion 124 of blocking region 120 may be disposed along high-K dielectric region 110, interposed between high-K dielectric region 110 and an interlevel isolation region 137. It is understood that STI region 130 and interlevel isolation region 137 are used for exemplary purposes, and may include any form of isolation, isolation region, gate-contact isolation, oxygen rich component, oxygen diffusing component, etc. In one embodiment, both capping portion 122 and spacing portion 124 may be disposed about portions of high-K dielectric 110 to shield gate 170. In one embodiment, blocking region 120 may include a material which blocks oxygen from diffusing into semiconductor device 100. In one embodiment, blocking region 120 may include silicon nitride. In another embodiment, blocking region 120 may include a material (e.g., Aluminum Nitride, Silicon Nitride, etc.) which blocks and/or absorbs oxygen. In one embodiment, blocking region 120 may include a material which is adapted to form an oxide layer when exposed to oxygen. In one embodiment, blocking region 120 may include Aluminum Nitride which forms an oxide layer as part of blocking region 120 interposed between high-K dielectric 110 and STI region 130. In another embodiment, blocking region 120 may include Silicon Nitride. In one embodiment, blocking region 120 may include both Aluminum Nitride and Silicon Nitride. In one embodiment, blocking region 120 may be adapted to block oxygen from diffusing into gate 170 and/or high-K dielectric region 110 from below. It is understood that while specific material examples for blocking region 120 are described herein, blocking region 120 may include any now known or later developed materials which provide the features described herein.

Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary.

Further, gate 170 can comprise any commonly used gate material including but not limited to polysilicon or high melting point refractory metals, such as W, Ti, Ta, Mo, Nb, Re, Ru and their binary or ternary metallic derivatives, e.g. WN, TiN, TaN, MoN, MoO2, TaSiN. Further, dielectric region 110 may be deposited between gate 170 and semiconductor substrate 140. Dielectric region 110 may comprise any commonly used gate dielectric material including but not limited to oxide, nitride, oxynitride, and high-k materials such as hafnium silicate, zirconium silicate, hafnium dioxide, and zirconium dioxide. Further, dielectric region 110 may include silicon dioxide ($SiO_2$), silicon nitride (SiN), or any other suitable material. Any number of dielectric regions may be located over the IC/chip body, as many other layers included in semiconductor chips now known or later developed. In one embodiment, dielectric region 110 may include silicon dioxide ($SiO_2$) for its insulating, mechanical and optical qualities. Dielectric region 110 may include, but is not limited to: silicon nitride ($Si_3N_4$), fluorinated $SiO_2$ (FSG), hydrogenated silicon oxycarbide (SiCOH), porous SiCOH, boro-phoshosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric region 110 may be deposited using conventional techniques described herein and/or those known in the art.

Figure 2:
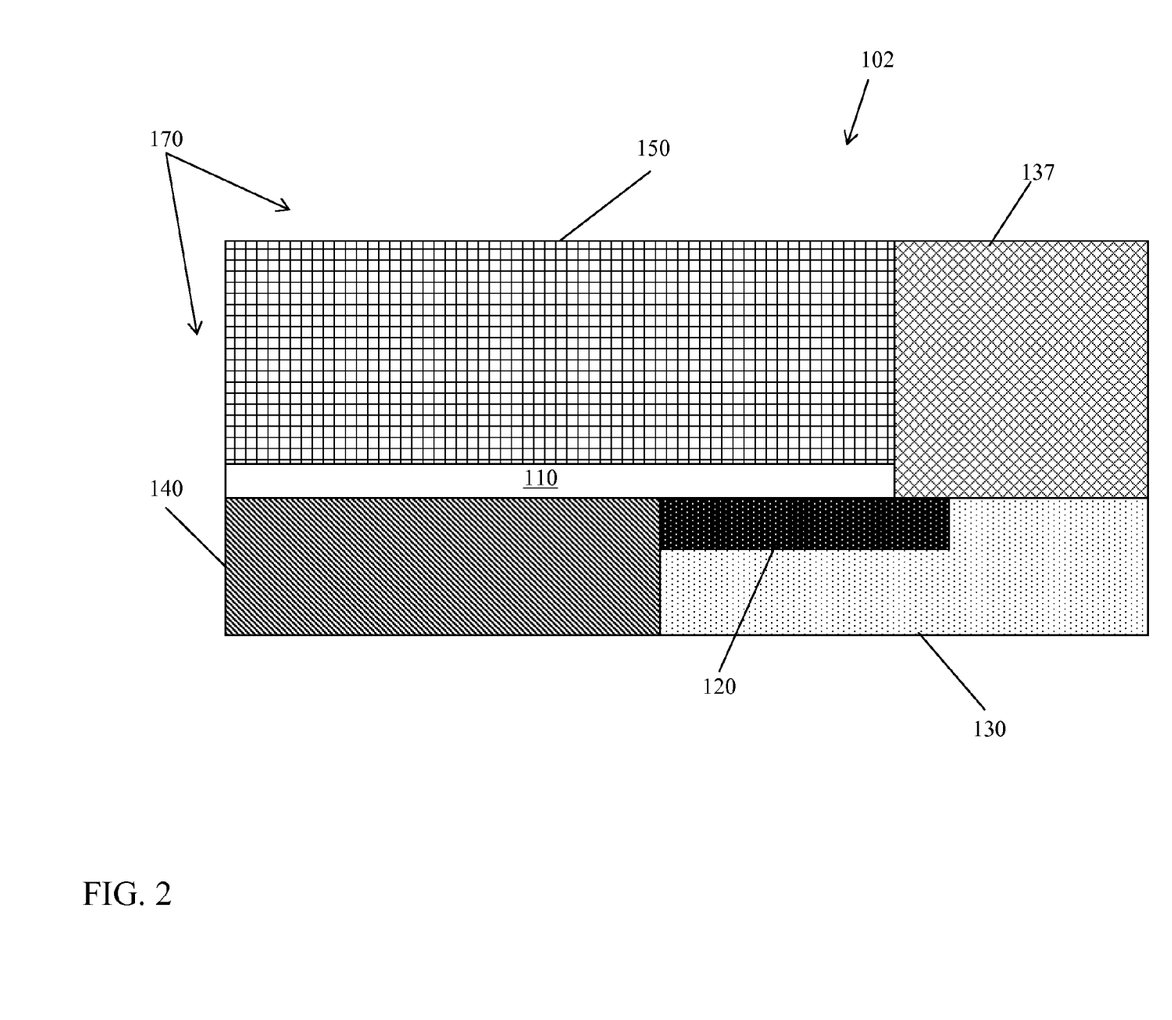
FIG. 2 shows portions of a semiconductor device according to an embodiment of the invention.
Figure 3:
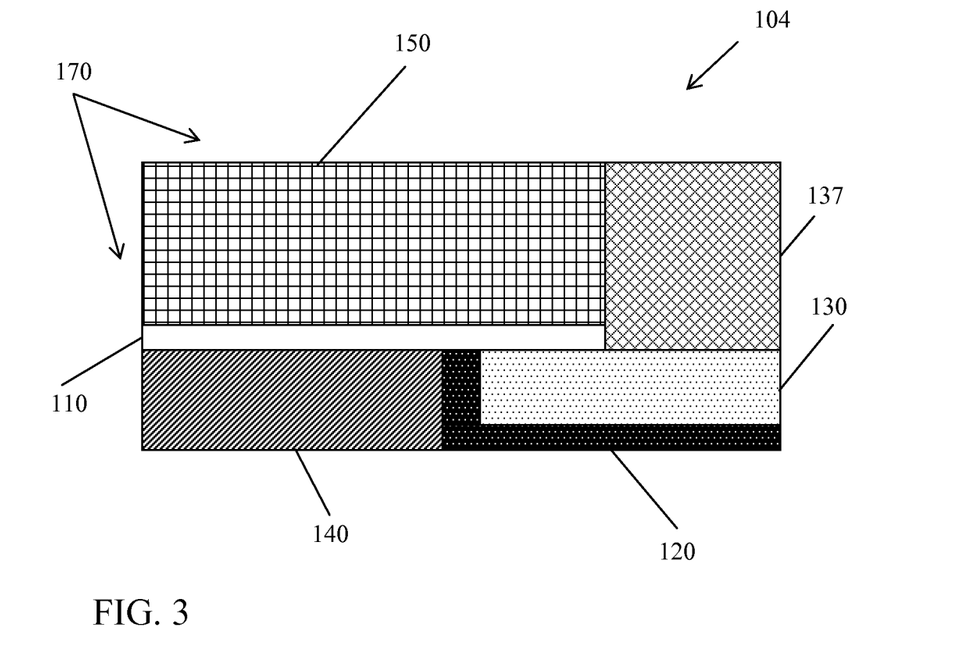
FIG. 3 shows portions of a semiconductor device according to an embodiment of the invention.
Figure 4:
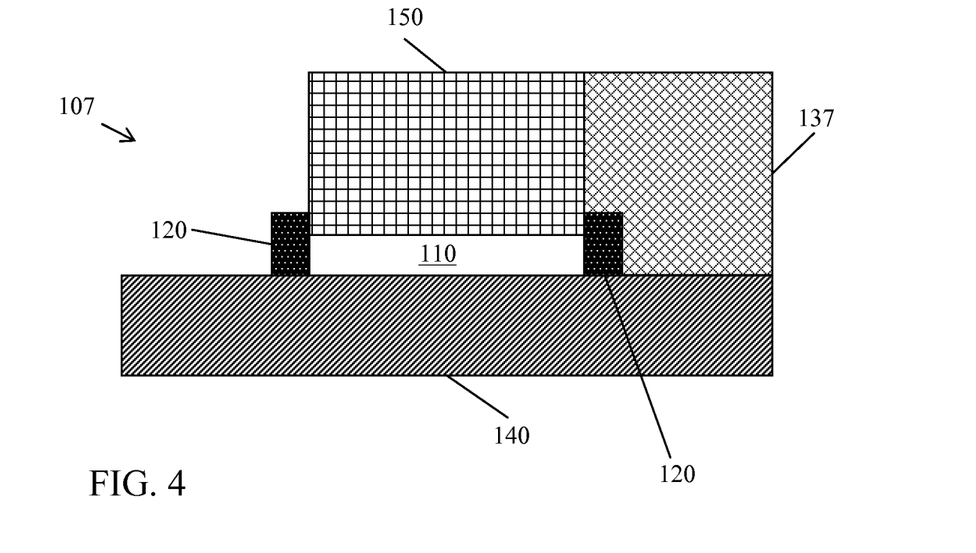
FIG. 4 shows portions of a semiconductor device according to an embodiment of the invention.
Figure 5:
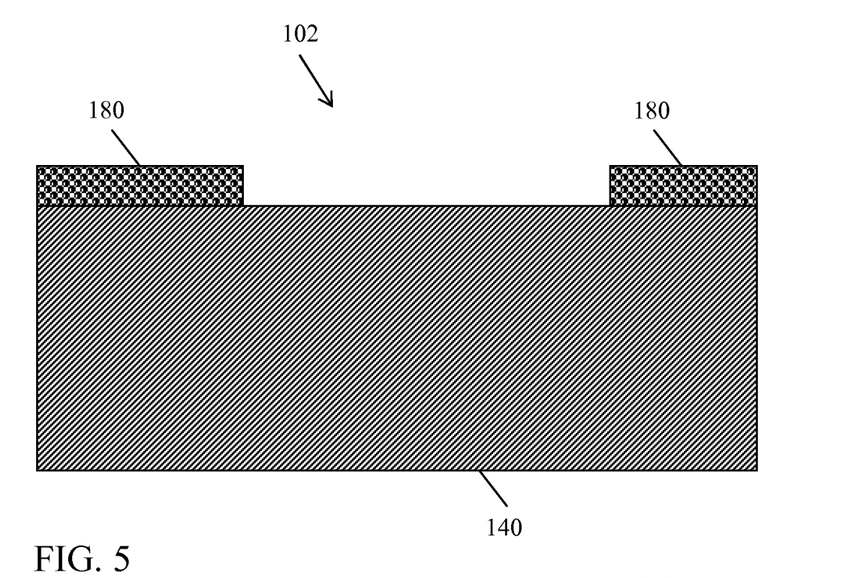
FIGS. 5-13 show a method of forming a semiconductor device according to embodiments of the invention.

Turning to FIG. 2, a cross sectional view of portions of a semiconductor device 102 is shown according to embodiments of the invention. In this embodiment, semiconductor device 102 includes a blocking region 120 interposed as a cap between a high-K dielectric region 110 and STI region 130. In one embodiment, blocking region 120 may be adapted to block and/or absorb oxygen which diffuses up through STI region 130 towards the bottom of high-K dielectric region 110. In another embodiment, shown in FIG. 3, a semiconductor device 104 includes blocking region 120 oriented as a liner for STI region 130 and/or high-K dielectric 110. In this embodiment blocking region 120 is disposed beneath STI region 130 and about at least one side of STI region 130, thereby blocking diffusion of oxygen into and/or out of STI region 130. In another embodiment, shown in FIG. 4, a semiconductor device 107 includes a blocking region 120 adapted as a set of spacers for high-K dielectric region 110. In this embodiment, blocking region 120 may be disposed about the sides of high-K dielectric region 110 to shield and/or space oxygen and other layers and devices in semiconductor device 107 from directly contacting high-K dielectric region 110.

FIGS. 5-13 show a device undergoing processes in a method according to embodiments. Although FIGS. 5-13 show the method of forming portions of a semiconductor device 102 in FIG. 2, it is understood that a similar method may be employed to form semiconductor device 100 of FIG. 1, semiconductor device 104 of FIG. 3, semiconductor device 107 of FIG. 4, or any other like semiconductor device.

Returning to FIG. 5, a cross-sectional view of semiconductor device 102 undergoing a process according to embodiments. In this embodiment, semiconductor device 102 has a set of pads 180 deposited on substrate 140. Set of pads 180 may include nitride or any other material commonly known. As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 6:
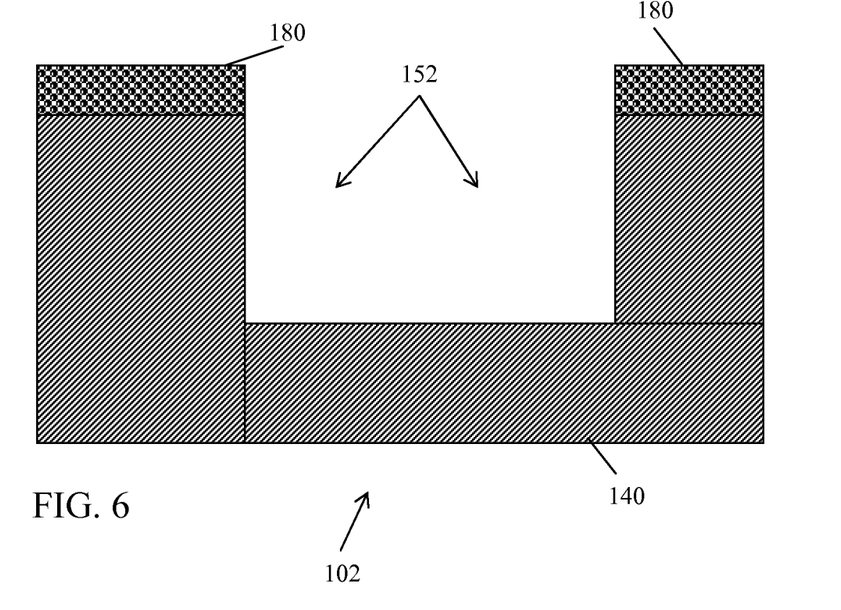

Next, as seen in FIG. 6, a trench 152 may be etched in substrate 140. Trench 152 may be etched using any now known or later developed etching techniques. In one embodiment, etching of substrate 140 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include O2 (oxygen), a dilutant, and one or more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Figure 7:
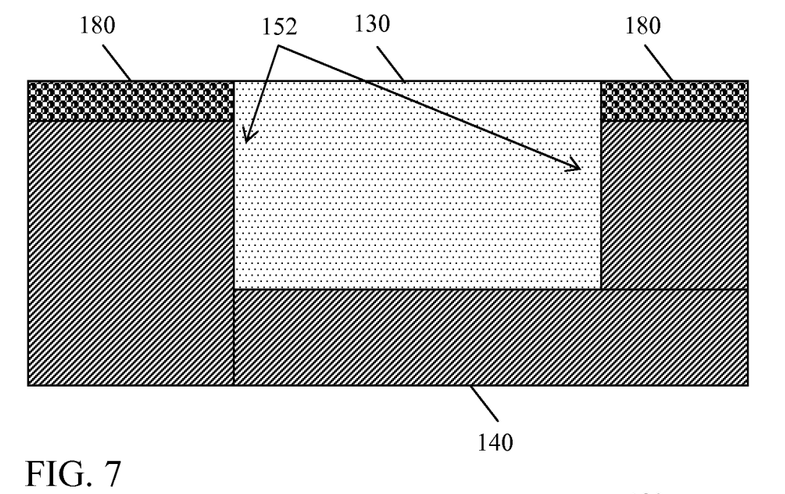
Figure 8:
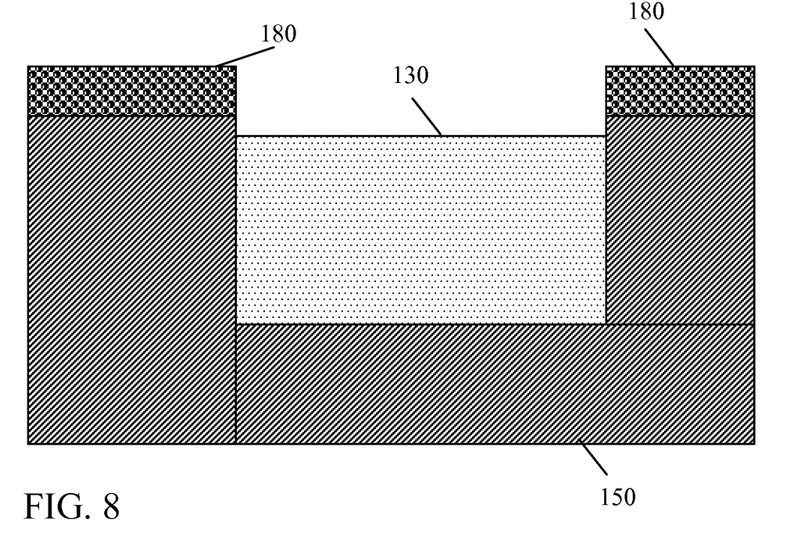

Next, as seen in FIG. 7, a STI region 130 may be formed/deposited in trench 152 over substrate 140. As mentioned above, STI region 130 may be deposited using any no known or later developed techniques. In one embodiment, following deposition of STI region 130, semiconductor device 102 may be polished to develop the surfaces. After deposition of STI region 130, as can be seen in FIG. 8, STI region 130 may be back etched and/or undercut to a level beneath portions of substrate 140. In one embodiment, this back etch may be performed using the RIE technique above.

Figure 9:
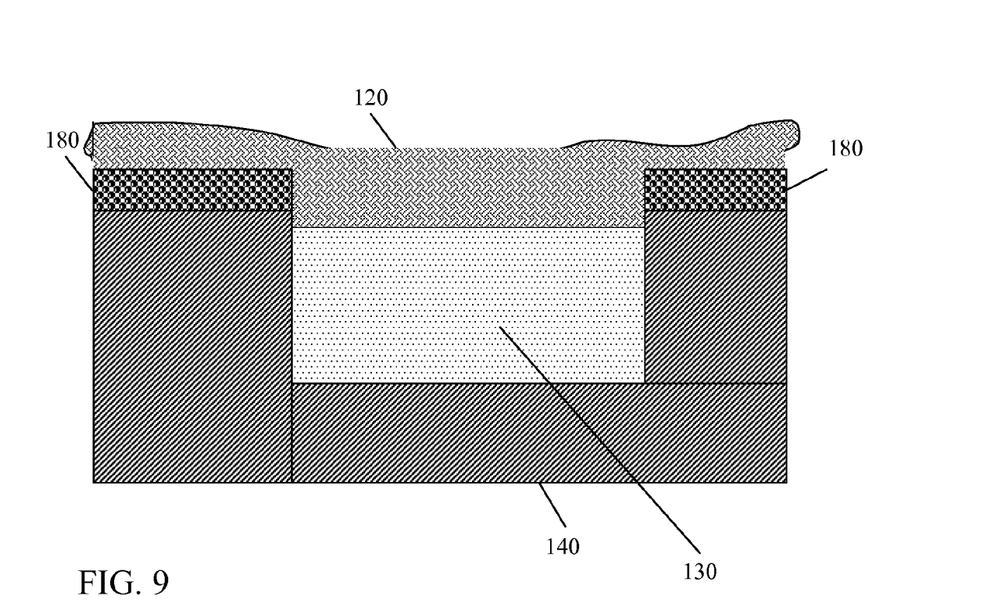

Turning now to FIG. 9, a blocking region 120 may be deposited upon substrate 140. In one embodiment, blocking region 120 substantially covers STI region 130 and set of pads 180. In another embodiment, blocking region 120 covers primarily STI region 130. In one embodiment, blocking region 120 comprises silicon nitride. In another embodiment, blocking region 120 comprises aluminum nitride. In another embodiment, blocking region 120 comprises silicon dioxide.

Figure 10:
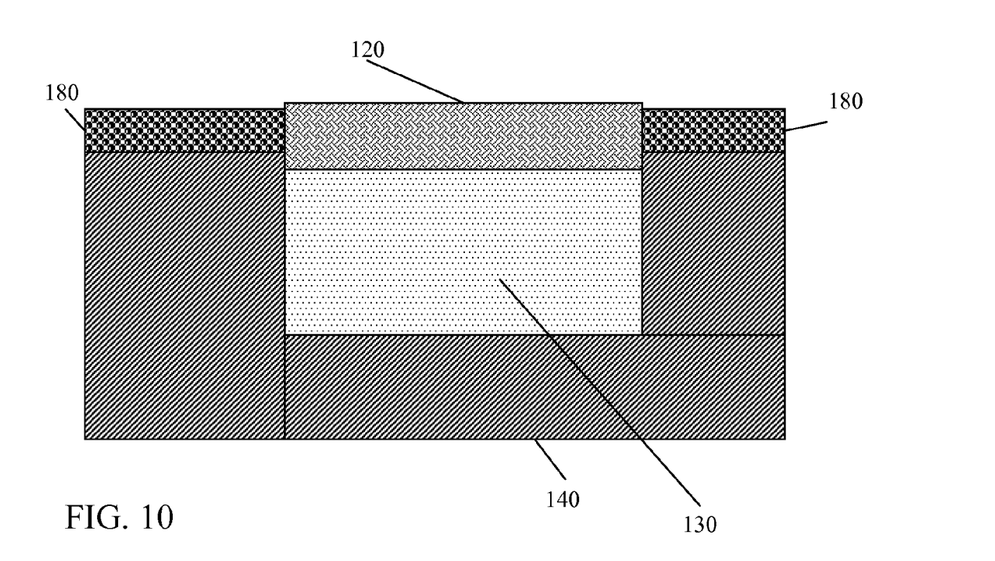

Next, as shown in FIG. 10, semiconductor device 102 is planarized. Planarization of semiconductor device 102 may be performed using any now known or later developed technique. In one embodiment, semiconductor device 102 is planarized to a degree such that blocking region 120 is substantially level with set of pads 180 upon substrate 140 and STI region 130.

Figure 11:
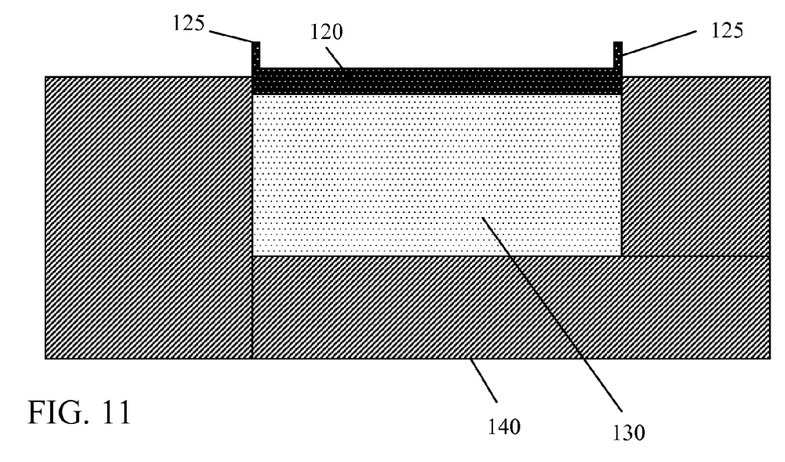
Figure 12:
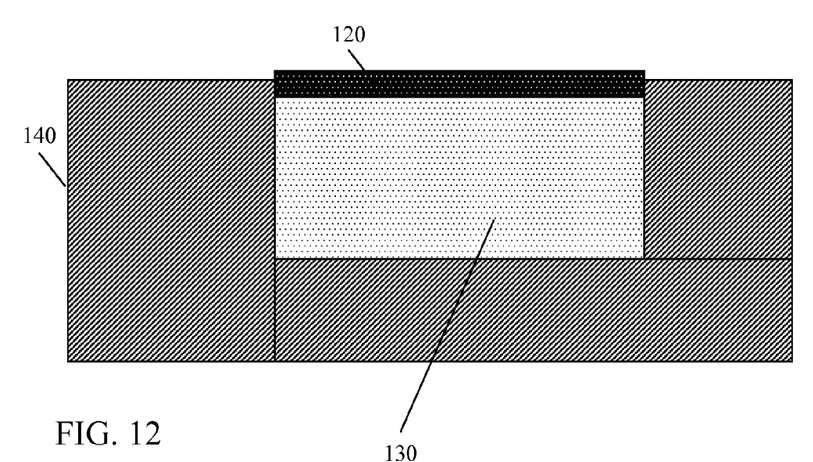
Figure 13:
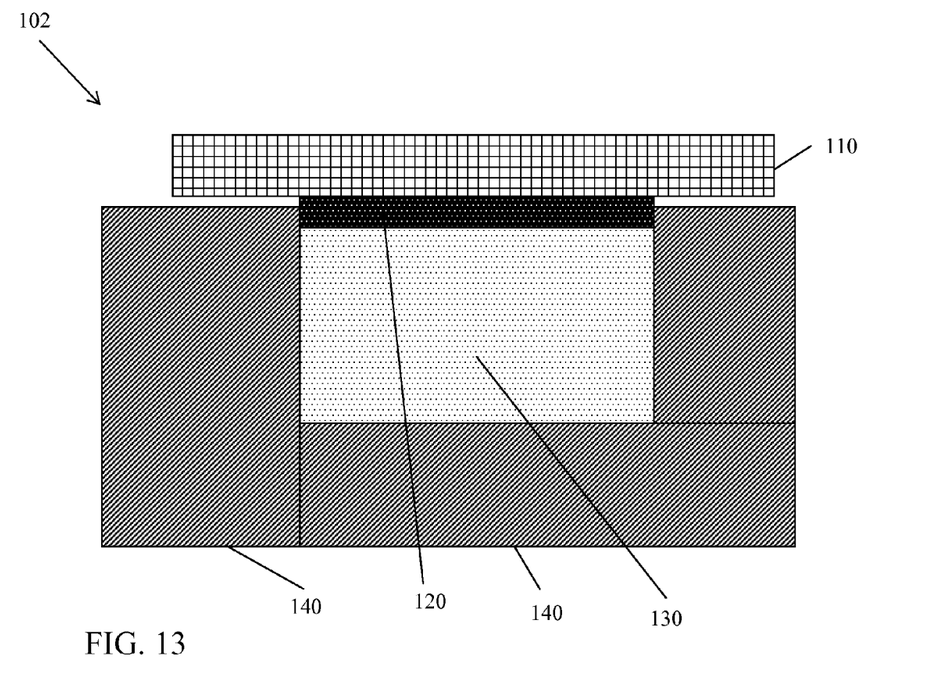

Next, as shown in FIG. 11, set of pads 180 are stripped from substrate 140 and blocking region 120 is formed into a cap 122 via planarization. In one embodiment, this stripping of set of nitride pads 180 is followed by a pre-cleaning of semiconductor device 102 to form cap 122 upon STI region 130. This stripping may undercut STI region 130, thereby enabling a complete seal upon application of a blocking material. In one embodiment, pre-cleaning may include application of hydrofluoric acid. In one embodiment, stripping of set of nitride pads 180 may form a set of blocking tabs 125. As seen in FIG. 12, blocking tabs 125 may be removed using any now known or later developed technique including planarization, etching, etc. Next, as seen in FIG. 13, a dielectric region 110 may be deposited on semiconductor device 102. In one embodiment, dielectric region 110 may substantially cover both cap 122 and substrate 140. In one embodiment, cap 122 may be interposed between dielectric region 110 and STI region 130, shielding dielectric region 110 from exposure to oxygen in STI region 130.

FIGS. 14-18 show a semiconductor device 100 and/or semiconductor device 102 undergoing processes according to a method in accordance with embodiments of the invention. Although FIGS. 14-18 show the method of forming portions of semiconductor device 100 in FIG. 1 and/or semiconductor device 102 in FIG. 2, it is understood that a similar method may be employed to form semiconductor device 104 of FIG. 3, semiconductor device 107 of FIG. 4, or any other like semiconductor device.

Figure 14:
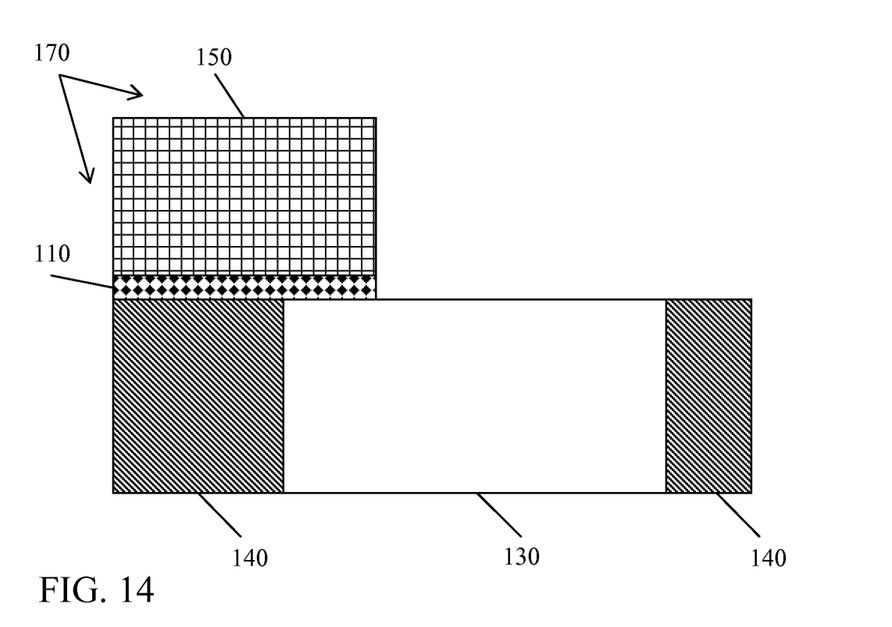
FIGS. 14-18 show a method of forming a semiconductor device according to embodiments of the invention.

Turning to FIG. 14, a cross-sectional view of portions of semiconductor device 100, including a substrate 140 with a shallow trench isolation (STI) region 130 defined therein is shown according to embodiments. STI region 130 may be formed in substrate 140 using any processes described herein or known. Semiconductor device 100 may further include portions of a gate region 170 disposed upon portions of substrate 140 and STI region 130. In one embodiment, gate region 170 may include a dielectric region 110 and an electrode region 150.

Figure 15:
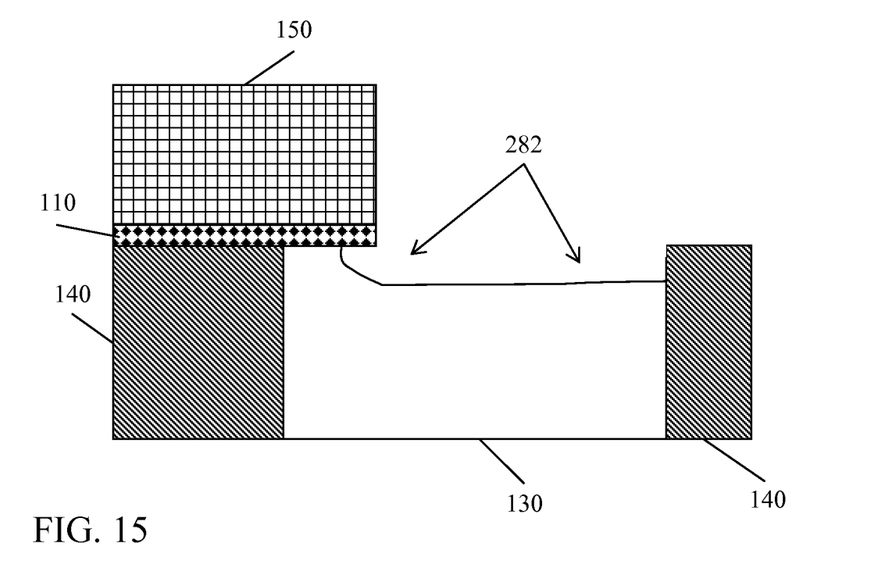

Next, as seen in FIG. 15, portions of STI region 130 may be etched to form a first undercut trench 282. In one embodiment, first undercut trench 282 may extend beneath portions of dielectric region 110, first undercut trench 282 forming a gap between STI region 130 and dielectric region 110 and/or gate region 170. First undercut trench 282 may be etched using any now known or later developed etching techniques. In one embodiment, first undercut trench 282 may be formed via an isotropic etch. In one embodiment, first undercut trench 282 may only partially undercut gate region 170.

Figure 16:
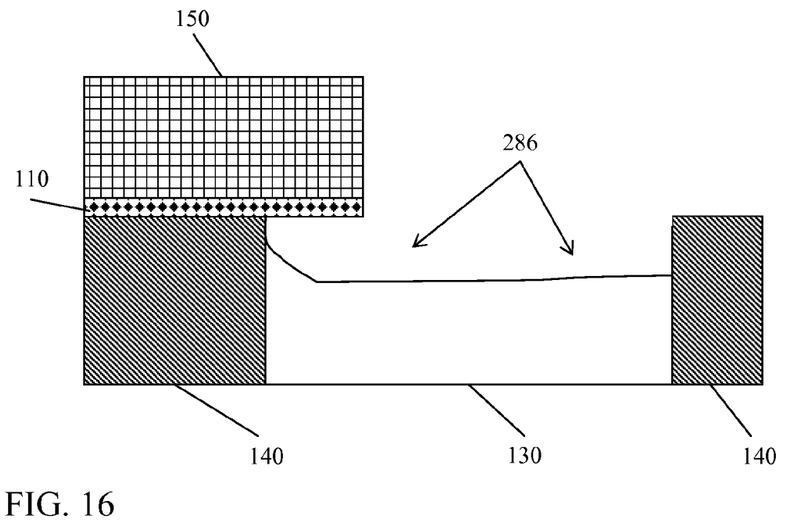
Figure 17:
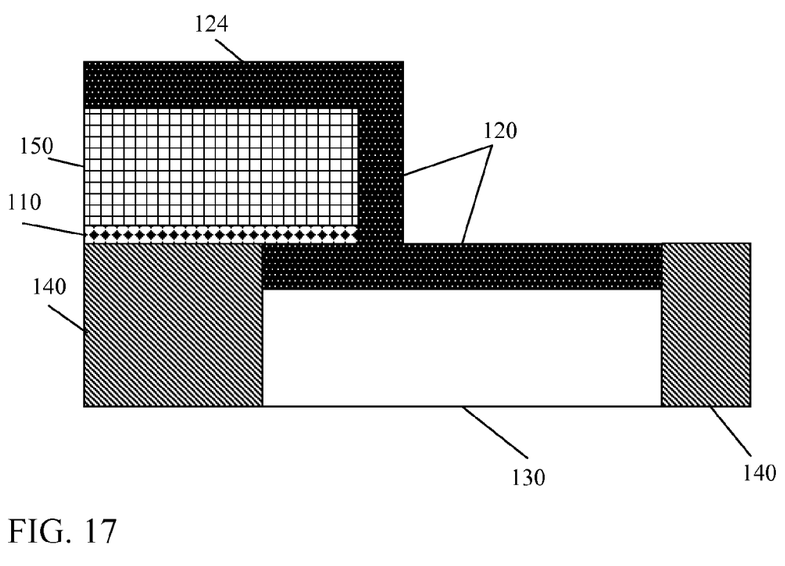

Next, as seen in FIG. 16, first undercut trench 282 may be further etched to undercut dielectric layer 110 and/or gate region 170, forming second undercut trench 286. In this embodiment, second undercut trench 286 may undercut gate region 170 all the way to an edge of substrate 140. As mentioned above, first undercut trench 282 and second undercut trench 286 may form a gap between STI region 130 and gate region 170. In one embodiment, first and second undercut trenches 282 and 286 may be formed as part of the same etch and/or process. In another embodiment, first and second undercut trenches 282 and 286 may be formed in two or more etches/processes. In one embodiment, these multiple etches may result in first undercut trench 282 and second undercut trench 286 having varied vertical-to-lateral etch characteristics relative one another. In one embodiment, formation of second undercut trench 286 may separate gate region 170 and STI region 130. After formation of either undercut trench 282 and/or undercut trench 286, as can be seen in FIG. 17, a blocking region 120 may be deposited and/or formed on semiconductor device 100. In one embodiment, blocking region 120 may substantially fill first and second undercut trenches 282 and 286. In one embodiment, blocking region 120 may be applied and/or deposited via a conformal deposition process. In one embodiment, blocking region 120 may prevent gate region 170 from directly contacting STI region 130. In another embodiment, blocking region 120 may substantially shield gate region 170 from contact with oxygen and or oxygen providing sources, regions and/or components.

Figure 18:
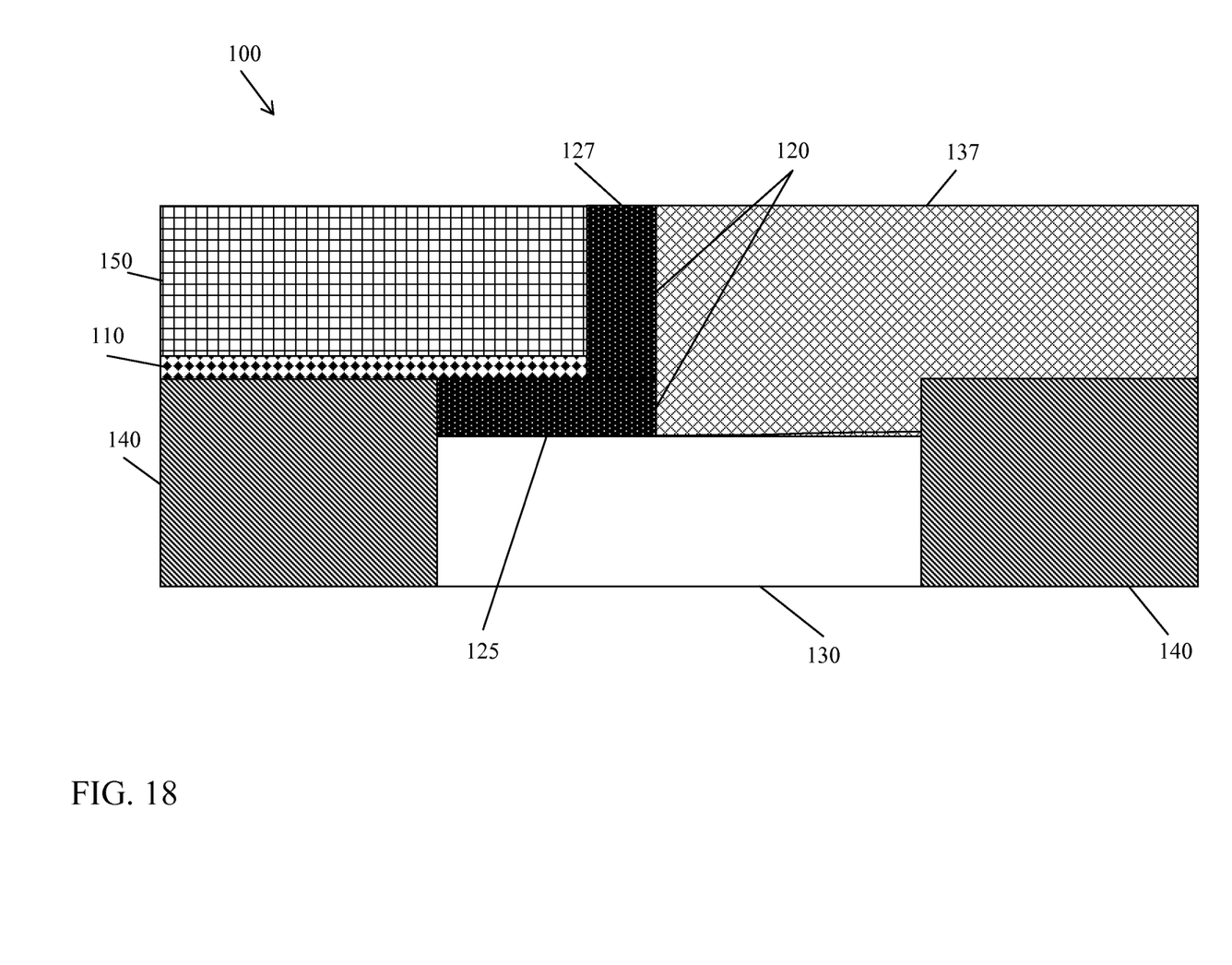

Next, as shown in FIG. 18, portions of blocking region 120 may be optionally removed from semiconductor device 100. In one embodiment, portions of blocking region 120 may be selectively removed. In one embodiment, semiconductor device 100 may be planarized to remove portions of blocking region 120. In another embodiment, semiconductor device 100 may be etched to remove portions of blocking region 120. In one embodiment, a top portion 124 (shown in FIG. 17) of blocking region 120 may be removed from the top of gate region 170, while a cap portion 125 and a spacer portion 127 of blocking region 120 may be retained. Cap portion 125 blocking oxygen diffusion into gate region 170 from STI region 130, and spacer portion 127 blocking oxygen diffusion into gate region 170 from an isolation region 137. Planarization of semiconductor device 102 may be performed using any now known or later developed technique.

Figure 19:
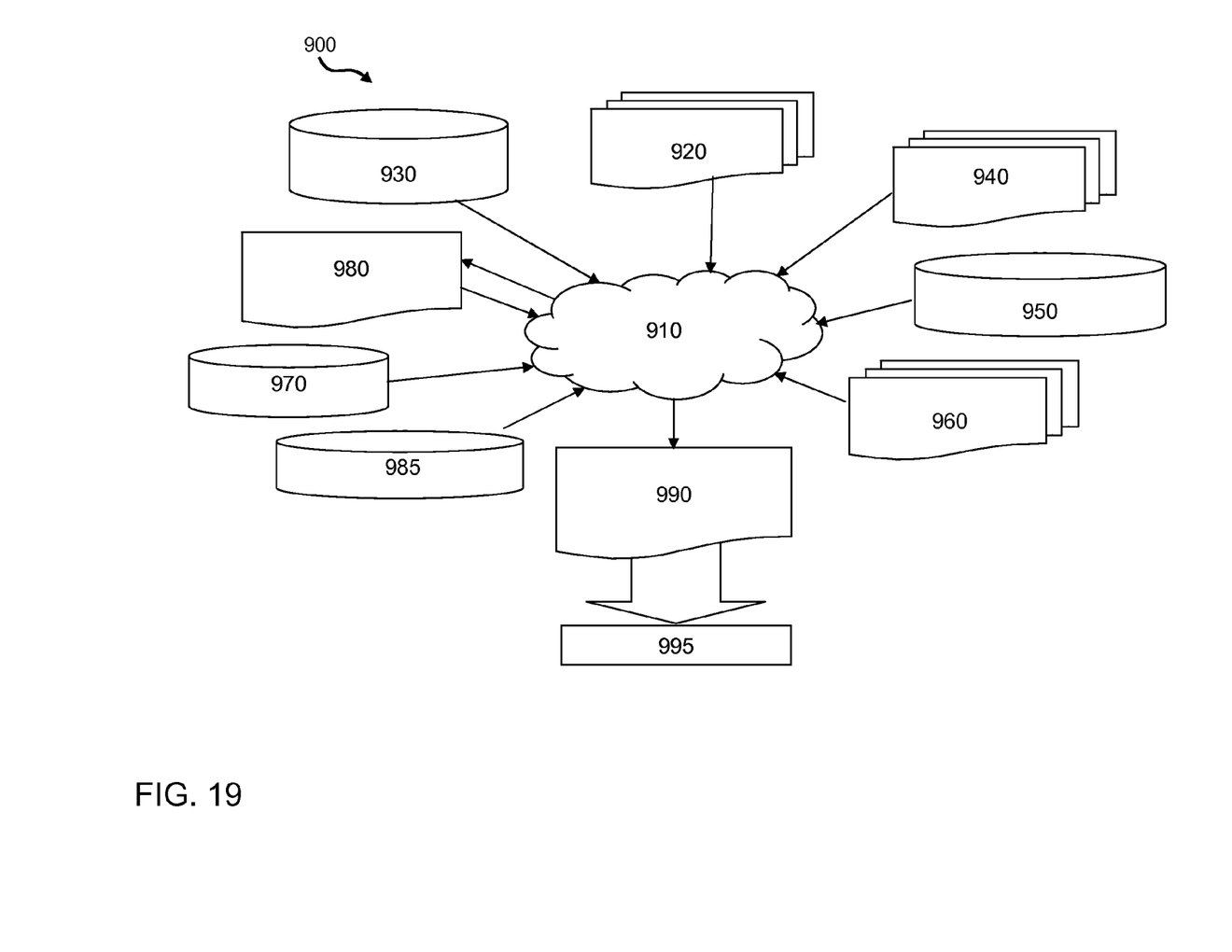
FIG. 19 shows a flow diagram of a design process used in semiconductor design, manufacture, and/or test according to embodiments of the invention.

FIG. 19 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor substrate comprising:
    a high-K dielectric region;
    a blocking region disposed beneath and against a first surface of the high-K dielectric region, the blocking region further disposed against at least one side surface of the high-K dielectric region distinct from the first surface of the high-K dielectric region, wherein the blocking region is adapted to form an oxidized layer in response to exposure to oxygen; and
    an oxygen rich region disposed against the blocking region such that the blocking region is interposed between the oxygen rich region and the high-K dielectric region.

2. The semiconductor substrate of claim 1, wherein the blocking region includes at least one of aluminum nitride or silicon nitride.

3. The semiconductor substrate of claim 1, wherein the blocking region is adapted to limit oxygen diffusion.

4. The semiconductor substrate of claim 1, wherein the oxygen rich region includes at least one of a shallow trench isolation or an interlevel isolation region.

5. The semiconductor substrate of claim 1, wherein the blocking region is configured to form a spacer structure about the high-K dielectric region, the spacer completely separating the high-K dielectric region from adjacent layers.

6. The semiconductor substrate of claim 1, wherein the blocking region is further disposed as a liner for the oxygen rich region.

7. A design structure tangibly embodied in a machine readable medium for design, manufacturing, or testing a semiconductor device, the design structure comprising:
    a substrate including:
        a high-K dielectric region;
        a blocking region disposed beneath and against a first surface of the high-K dielectric region, the blocking region further disposed against at least one side surface of the high-K dielectric region distinct from the first surface of the high-K dielectric region, wherein the blocking region is adapted to form an oxidized layer in response to exposure to oxygen; and
        an oxygen rich region disposed against the blocking region such that the blocking region is interposed between the oxygen rich region and the high-K dielectric region.

8. The design structure of claim 7, wherein the blocking region includes at least one of aluminum nitride or silicon nitride.

9. The design structure of claim 7, wherein the oxygen rich region includes at least one of a shallow trench isolation or an interlevel isolation region.

10. The design structure of claim 7, wherein the blocking region is configured to form a spacer structure about the high-K dielectric region, the spacer completely separating the high-K dielectric region from adjacent layers.

11. The design structure of claim 7, wherein the blocking region is further disposed as a liner for the oxygen rich region.

12. The semiconductor substrate of claim 1, wherein the blocking region includes aluminum nitride.

13. The design structure of claim 7, wherein the blocking region includes aluminum nitride.

14. A semiconductor device comprising:
    a gate region including:
        an electrode;
        a high-K dielectric region disposed beneath and against the electrode; and
        a blocking region disposed beneath and against a first surface of the high-K dielectric region, the blocking region further disposed against at least one side surface of the high-K dielectric region distinct from the first surface of the high-K dielectric region, wherein the blocking region is further disposed against a side surface of the electrode and a top surface of the electrode, the blocking region being adapted to form an oxidized layer in response to exposure to oxygen, the blocking region including aluminum nitride; and
    an oxygen rich region disposed against the blocking region such that the blocking region is interposed between the oxygen rich region and the high-K dielectric region.

15. The semiconductor device of claim 14, wherein the blocking region substantially shields the gate region from oxygen.

* * * * *